US012620447B2

(12) United States Patent
Khayat et al.

(10) Patent No.: US 12,620,447 B2
(45) Date of Patent: May 5, 2026

(54) ADAPTIVE TEMPERATURE COMPENSATION FOR A MEMORY DEVICE

(71) Applicant: MICRON TECHNOLOGY, INC., Boise, ID (US)

(72) Inventors: Patrick R. Khayat, San Diego, CA (US); Hyungseok Kim, Santa Clara, CA (US); Steven Michael Kientz, Westminster, CO (US); Zixiang Loh, Folsom, CA (US); Jun Wan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 18/758,496

(22) Filed: Jun. 28, 2024

(65) Prior Publication Data

US 2025/0014654 A1 Jan. 9, 2025

Related U.S. Application Data

(60) Provisional application No. 63/524,995, filed on Jul. 5, 2023.

(51) Int. Cl.
| | |
|---|---|
| *G11C 11/00* | (2006.01) |
| *G11C 16/26* | (2006.01) |
| *G11C 16/34* | (2006.01) |
| *G11C 29/56* | (2006.01) |

(52) U.S. Cl.
CPC .......... *G11C 16/3418* (2013.01); *G11C 16/26* (2013.01); *G11C 29/56* (2013.01)

(58) Field of Classification Search
CPC ...... G11C 16/3418; G11C 16/26; G11C 29/56
See application file for complete search history.

(56) References Cited

U.S. PATENT DOCUMENTS

| | | | | |
|---|---|---|---|---|
| 10,790,031 | B1 * | 9/2020 | Sagdeo | ................. G11C 16/26 |
| 2018/0293029 | A1 * | 10/2018 | Achtenberg | ......... G11C 29/028 |
| 2022/0068399 | A1 * | 3/2022 | Cho | ......................... G11C 7/04 |

* cited by examiner

*Primary Examiner* — Pho M Luu
(74) *Attorney, Agent, or Firm* — Lowenstein Sandler LLP

(57) ABSTRACT

A system includes a memory device; and a processing device, operatively coupled to the memory device, the processing device to perform operations including: receiving a request to perform a read operation, the request identifying a set of memory cells in a portion of a memory device; determining a first temperature of the set of memory cells, wherein the first temperature is associated with a first error handing operation of an error handling flow directed to the set of memory cells; determining an offset value to be applied to a temperature compensation coefficient of a parameter of a set of parameters associated with the set of memory cells, wherein the offset value is associated with a temperature range comprising the first temperature; determining a second temperature of the set of memory cells, wherein the second temperature is associated with a second error handling operation following the first error handing operation of the error handling flow directed to the set of memory cells; and responsive to determining that the second temperature falls in the temperature range comprising the first temperature, adjusting, based on the offset value, a temperature compensation value used in the second error handling operation.

20 Claims, 7 Drawing Sheets

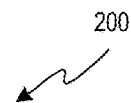

200

Receive a request to perform a read operation, the request identifying a memory cell in a segment of a memory device

210

Determine a temperature for the read operation

220

Determine an offset value to a temperature compensation coefficient for a trim of a set of trims associated with the read operation, wherein the offset value is associated with a temperature swing within a specific range of the determined temperature

230

Store the offset value and the temperature swing for use in the subsequent operation

240

Adjust, based on the offset value, a temperature compensation value in processing a subsequent operation in an error handling flow directed to the memory cell

| temperature compensation parameters | temperature compensation coefficients | temperature compensation values (with respect to temperature) | | | | | |
| --- | --- | --- | --- | --- | --- | --- | --- |
| | | 24° C | 25° C | 26° C | 27° C | 28° C | 29° C |
| L1~L3 | 28 | 14 | 14 | 14 | 13 | 13 | 13 |
| L4~L6 | 27 | 13 | 13 | 13 | 13 | 13 | 12 |
| L7~L9 | 26 | 13 | 13 | 13 | 12 | 12 | 12 |
| L10~L12 | 25 | 12 | 12 | 12 | 12 | 12 | 11 |
| L13~L15 | 24 | 12 | 12 | 12 | 11 | 11 | 11 |
| tsense | 6 | 3 | 3 | 3 | 2 | 2 | 2 |
| vslot | 10 | 5 | 5 | 5 | 4 | 4 | 4 |

300B

| temperature compensation parameters | temperature compensation coefficients | temperature compensation values (with respect to temperature) | | | | | |
|---|---|---|---|---|---|---|---|
| | | 24° C | 25° C | 26° C | 27° C | 28° C | 29° C |
| L1~L3 | 29 | 14 | 14 | 14 | 14 | 14 | 13 |
| L4~L6 | 27 | 13 | 13 | 13 | 13 | 13 | 12 |
| L7~L9 | 27 | 13 | 13 | 13 | 13 | 13 | 12 |
| L10~L12 | 25 | 12 | 12 | 12 | 12 | 12 | 11 |
| L13~L15 | 25 | 12 | 12 | 12 | 12 | 12 | 11 |
| tsense | 7 | 3 | 3 | 3 | 3 | 3 | 3 |
| vslot | 11 | 5 | 5 | 5 | 5 | 5 | 5 |

| temperature compensation parameters | temperature compensation coefficients | temperature compensation values (with respect to temperature) | | | | | | |
|---|---|---|---|---|---|---|---|---|
| | | 24° C | 25° C | 26° C | 27° C | 28° C | 29° C |
| L1~L3 | 27 | 13 | 13 | 13 | 13 | 13 | 12 |
| L4~L6 | 27 | 13 | 13 | 13 | 13 | 13 | 12 |
| L7~L9 | 25 | 12 | 12 | 12 | 12 | 12 | 11 |
| L10~L12 | 25 | 12 | 12 | 12 | 12 | 12 | 11 |
| L13~L15 | 23 | 11 | 11 | 11 | 11 | 11 | 10 |
| tsense | 5 | 2 | 2 | 2 | 2 | 2 | 2 |
| vslot | 9 | 4 | 4 | 4 | 4 | 4 | 4 |

| temperature compensation parameters | temperature compensation coefficients | temperature compensation coefficients offset values & temperature ranges (with respect to temperature) | | | | | | | | | | | | | |
|---|---|---|---|---|---|---|---|---|---|---|---|---|---|---|---|
| | | 20 | 21 | 22 | 23 | 24 | 25 | 26 | 27 | 28 | 29 | 30 | 31 | 32 | 33 |
| L1-L3 | 28 | [0,1] | [1,1] | [-1,1] | [0,1] | [0,2] | [0,1] | [1,2] | [1,1] | [0,1] | [0,1] | [1,1] | [-1,2] | [0,1] | [0,2] |
| L4-L6 | 27 | [0,1] | [0,2] | [0,1] | [1,1] | [-1,2] | [0,1] | [0,2] | [0,1] | [1,1] | [-1,1] | [0,1] | [0,2] | [0,1] | [1,2] |
| L7-L9 | 26 | [0,1] | [1,2] | [-1,1] | [0,1] | [0,2] | [0,1] | [1,2] | [1,1] | [0,1] | [0,1] | [1,1] | [-1,2] | [0,1] | [0,2] |
| L10-L12 | 25 | [0,1] | [0,2] | [0,1] | [1,1] | [-1,2] | [0,1] | [0,3] | [0,1] | [1,1] | [-1,2] | [0,1] | [0,2] | [0,1] | [1,2] |
| L13-L15 | 24 | [1,1] | [-1,2] | [0,1] | [0,2] | [0,2] | [0,1] | [1,2] | [-1,1] | [0,1] | [0,2] | [0,1] | [1,2] | [-1,2] | [0,1] |
| tsense | 6 | [0,5] | [0,5] | [1,5] | [1,5] | [1,5] | [1,5] | [1,5] | [-1,5] | [-1,5] | [-1,5] | [-1,5] | [-1,5] | [0,5] | [0,5] |
| vslat | 10 | [0,5] | [0,5] | [0,4] | [0,3] | [1,3] | [1,4] | [0,5] | [-1,5] | [-1,5] | [-1,4] | [0,3] | [0,4] | [0,5] | [0,5] |

ADAPTIVE TEMPERATURE COMPENSATION FOR A MEMORY DEVICE

RELATED APPLICATIONS

This application claims the benefit of U.S. Provisional Patent Application No. 63/524,995, filed Jul. 5, 2023, the entire contents of which are incorporated by reference herein.

TECHNICAL FIELD

Embodiments of the disclosure relate generally to memory sub-systems, and more specifically, relate to adaptive temperature compensation for a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a flow diagram of an example method of adaptive temperature compensation, in accordance with some embodiments of the present disclosure.

FIGS. 3A-3C illustrate examples of data for adaptive temperature compensation, in accordance with some embodiments of the present disclosure;

DETAILED DESCRIPTION

Figure 1:
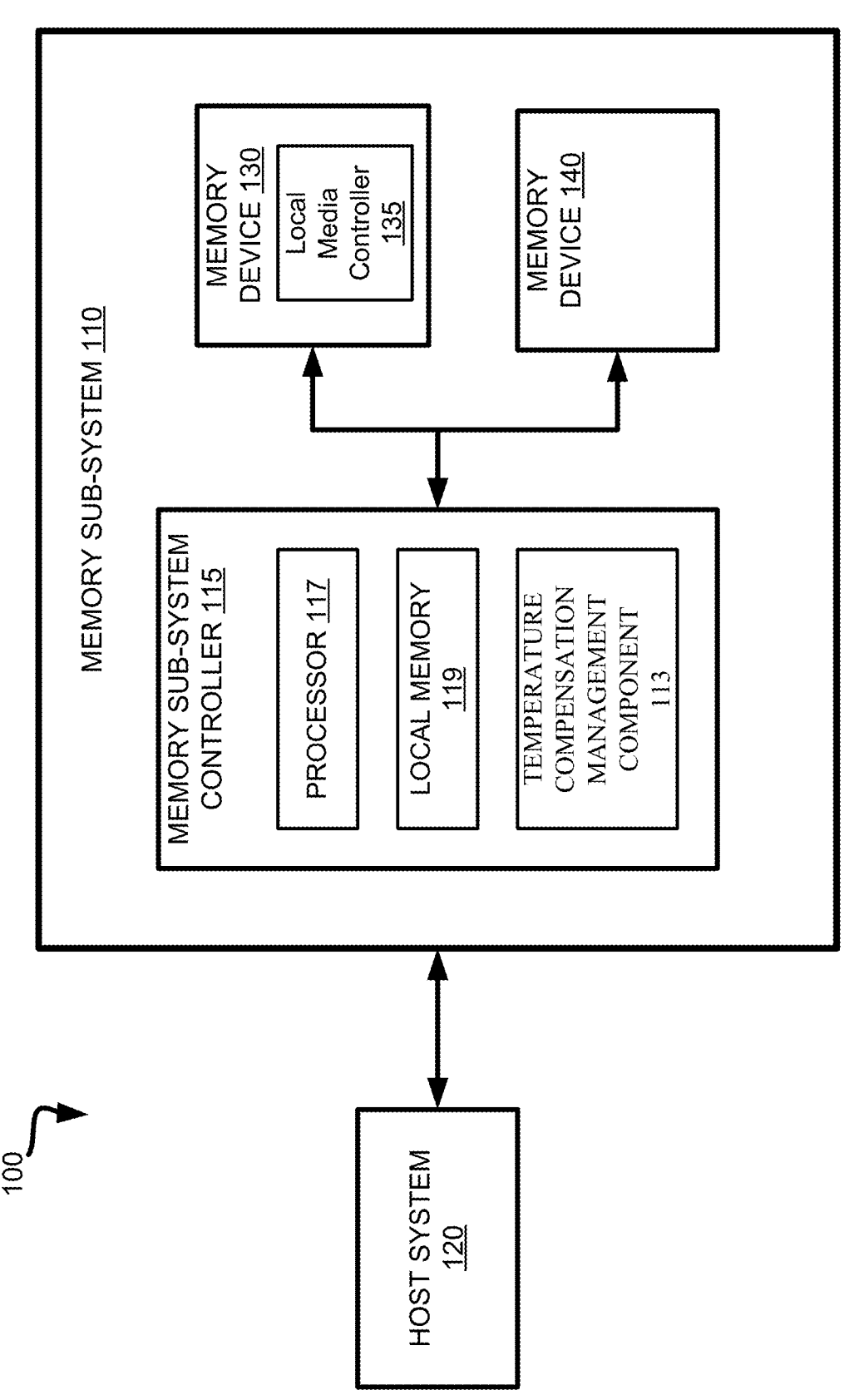
FIG. 1 illustrates an example computing system that includes a memory sub-system in accordance with some embodiments of the present disclosure.

Aspects of the present disclosure are directed to adaptive temperature compensation for a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or a three-dimensional grid. Memory cells are formed onto a silicon wafer in an array of columns and rows. A memory device can further include conductive lines connected to respective ones of the memory cells, referred to as wordlines and bitlines. The intersection of a bitline and a wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses) can result in read operations performed on two or more of the memory planes of the memory device.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error-handling data (e.g., error correction code (ECC) codeword parity data), data version (e.g., used to distinguish age of data written), valid bitmap (which LBAs or logical transfer units contain valid data), etc.

A memory device includes multiple memory cells capable of storing, depending on the memory cell type, one or more bits of information. One type of cell is a single level cell (SLC), which stores 1 bit per cell and defines 2 logical states ("states") ("1" or "L0" and "0" or "L1") each corresponding to a respective $V_T$ level. Another type of cell is a multi-level cell (MLC), which stores 2 bits per cell and defines 4 states ("11" or "L0", "10" or "L1", "01" or "L2" and "00" or "L3")

each corresponding to a respective $V_T$ level. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2" levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A memory cell can be programmed (written to) by applying a certain voltage to the memory cell, which results in an electric charge being held by the memory cell, which is called the "threshold voltage" and denoted as Vt. A memory device can have distributions that are narrow compared with the working range of control voltages tolerated by the cells of the device. Accordingly, multiple distributions (with "valleys" between distributions) can be fit into the working voltage window allowing storing and reliably detecting multiple bits per cell such as 23=8 distributions (7 valleys) for TLC, $2^2$=4 distributions (3 valleys) for MLC etc. The distributions are interspersed with voltage intervals ("valley margins") between distributions where none (or very few) of the memory cells of the device have their threshold voltages. Therefore, such valley margins can be used to separate various charge states—the logical state of the cell can be determined by detecting, during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N-1$ read voltages are applied to distinguish $2^N$ distributions. Specifically, the read operation can be performed by comparing the measured threshold voltage $V_T$ exhibited by the memory cell to one or more reference voltage levels corresponding to known valleys (e.g., centers of the valleys) of the memory device ("read level threshold").

Due to the phenomenon known as slow charge loss (SCL), the threshold voltage $V_T$ of a memory cell can change with time as the electric charge of the cell is diminishing, the process sometimes referred to as "temporal voltage shift" (TVS). Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately log-linear or power-law fashion $$(\Delta V_T(t) = -C * t^b)$$

with respect to the time t elapsed since the cell programming event. TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T$ 4 $V_T+\Delta V_T$ where $\Delta V_T$ is negative due to charge loss.

"Read error" refers to a memory sub-system's failure to validate one or more data items that have been retrieved from a memory device in response to a read command. Read errors can be associated with host-initiated read operations or system-initiated scanning operations and can occur due to, for example, the measured threshold voltage $V_T$ exhibited by the memory cell mismatching the read voltage levels due to TVS, the requested data being subjected to noise or interference, etc. In a read error, the number of bit errors in the read data is greater than what the underlying error correction code (ECC) can correct and this results in an ECC failure. In response to a read error, the memory sub-system can perform an error-handling flow in an attempt to recover the data. The error-handling flow can include one or more error-handling operations performed with respect to the data items that have been retrieved from the memory device. An error handling operation, for example, can include one or more read retries using different parameters, such as a change in read voltage, as compared to the initial read operation performed on the memory cell. The error-handling operation can also include "deep error handling techniques," such as forward error correction (FEC) with various versions of reliability information, hybrid automatic repeat request (HARQ), etc.

The memory sub-system controller may implement an error-handling flow including predefined error-handling operations, which may be initially set based on characterization data collected during product development, and remains static even as the actual operating conditions changes. Certain changes in operating conditions, for example, varying temperatures (e.g., 0 to 75° C.), may result in inefficiencies in the predefined error-handling operations, such as increased latency. Even minor temperature variations over time, such as a period of time between the time when data is written to a memory cell and the time when data is read from the memory cell, can impact the charges stored in and read from the memory cell. (e.g., causing a threshold voltage shift).

The change in temperature between the time when the data is written and the time when the data is read from a set of memory cells can be referred to as the cross temperature of the set of memory cells. Cross temperature conditions occur when the memory cell is programmed at a hot temperature range (e.g., above a predefined threshold value) and read at a cold temperature range or when the memory cell is programmed at a cold temperature range and read at a hot temperature range. The cold temperature range refers to a temperature value below a predefined threshold value, and the hot temperature range refers to a temperature value above a predefined threshold value. Accordingly, depending on how the threshold voltage ranges (i.e., levels) are defined in the memory cell, the apparent read voltage may reflect a data value different from the correct data value. This difference can result in an increased raw bit error rate (RBER), which can be beyond the error correction capability of the underlying error correction code (ECC). In addition, the amount that the voltage shifts over time may change as the change in temperature increases. A temperature compensation value is an offset to be applied to a read voltage to compensate for the voltage shift due to temperature variation, including the cross temperature. Depending on manufacturing variations in memory cells and memory devices, memory cells on a particular die may exhibit relatively similar behavior with respect to voltage shifts in response to changes in temperature. Accordingly, each die in the memory device may have a separate temperature compensation value rather than using a single temperature compensation value for the entire memory device. In other embodiments, a temperature compensation value for some other level of granularity can be used, such as per cell, per block, per package, or per device compensation value.

Due to the temperature variations such as temperature sensing noise (e.g., small temperature fluctuations caused by the temperature sensors) or ambient temperature fluctuations (e.g., on one or more dies), multiple temperature compensation values can be affected even if the temperature has not changed much, for example, being within one to several degree Celsius. Changes in the temperature compensation values can cause read threshold voltage shifts and lead to raw bit error rate (RBER) spikes that are associated with threshold voltage shifts. The affected temperature compensation values can cause read threshold voltage shifts between read operations, especially, during the read error handling, where early operations in the error-handling flow can optimize the read threshold voltages and use the read threshold voltages in later operations in the error-handling flow for more complex read error handling.

Aspects of the present disclosure address the above and other deficiencies by providing a memory sub-system that adjusts temperature compensation values to reduce the effect caused by temperature fluctuations for a memory device. In particular, the memory sub-system controller can determine the temperature of a set of memory cells in a portion of the memory device. In some implementations, the temperature is determined during or after the first error handing operation in the error handling flow. A set of parameters associated with temperature compensation may be used in the error handing flow. For each parameter, a default temperature compensation coefficient can be used in the first error handing operation. Using the default temperature compensation coefficient, a set of default temperature compensation values can be calculated for each parameter. The set of default temperature compensation values is applied in the first error handing operation. The set of parameters associated with temperature compensation can include read level temperature compensation parameter, sensing time temperature compensation parameter, source plate potential temperature compensation parameter, wordline group temperature compensation parameter, etc. In one example, the read level temperature compensation parameter is the offset voltage applied to the read level voltage that is used to read data from a set of the memory cells; the sensing time temperature compensation parameter refers to a value of an offset voltage associated with sensing time used to read data from a set of the memory cells; the source plate potential temperature compensation parameter refers to a value of an offset voltage associated with source plate potential used to read data from a set of the memory cells; and the wordline groups temperature compensation parameter refers to a value of an offset voltage associated with wordline groups used to read data from a set of the memory cells.

The memory sub-system controller can determine, based on the determined temperature, the default temperature compensation coefficient, and the default temperature compensation values, an offset value to the temperature compensation coefficient for one or more parameters of the set of parameters associated with temperature compensation. The memory sub-system controller can determine a temperature range of the determined temperature. The temperature range corresponds to the offset value. The offset value and the temperature range are determined in a manner of keeping the temperature compensation value used in the subsequent error handing operation unchanged from the temperature compensation value used in the first error handing operation responsive to a temperature of the subsequent error handling operation falls in the temperature range of the determined temperature. Here, the temperature compensation value used in the subsequent error handing operation is calculated by adding the offset value to a default temperature compensation coefficient to obtain an adjusted temperature compensation coefficient and using a predetermined formula based on the adjusted temperature compensation coefficient to obtain the temperature compensation value, and the temperature compensation value used in the first error handing operation is calculated using the predetermined formula based on the default temperature compensation coefficient.

The memory sub-system controller can store the offset value and the temperature range for use in the subsequent operation(s) after the first error handing operation in the error handling flow directed to the set of the memory cells. As such, when the memory sub-system controller continues the error-handling flow, the memory sub-system controller can, at the beginning of processing the subsequent operation, determine a current temperature and check whether the current temperature falls in the temperature range of the determined temperature, responsive to determining the current temperature falls in the temperature range, calculate the adjusted temperature compensation coefficient by adding the offset value to a default value, and calculate the adjusted temperature compensation value based on the adjusted temperature compensation coefficient according to a predetermined formula. The memory sub-system controller then applies the adjusted temperature compensation value in processing the subsequent operation so that the temperature fluctuation during the subsequent operation would not adversely affect the operations in the error handling flow.

Advantages of the present disclosure include, but are not limited to, providing an enhanced resistance to temperature fluctuations, thereby reducing the error rates of the memory device. Additionally, adaptively updating the temperature compensation coefficient to account for temperature variations increases the performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a temperature compensation management component 113 that can adjust temperature compensation values to reduce the effect caused by temperature fluctuations. In some embodiments, the memory sub-system controller 115 includes at least a portion of the temperature compensation management component 113. In some embodiments, the temperature compensation management component 113 is part of the host system 110, an application, or an operating system. In other embodiments, local media controller 135 includes at least a portion of temperature compensation management component 113 and is configured to perform the functionality described herein. Further details with regards to the operations of the temperature compensation management component 113 are described below.

FIG. 2 is a flow diagram of an example method 200 for adjusts temperature compensation values to reduce the effect caused by temperature fluctuation for a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the temperature compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic may receive a request to perform a read operation ("a read command") on the memory device, the request identifying one or more memory cells in a segment of the memory device. For example, the request may specify logical address that can be used to identify a set of cells of a memory device. The set of cells of the memory device may include one or more units (e.g., a group of memory cells, a wordline group, a wordline, or individual memory cells) of a memory array of a memory device, such as memory device 130. In one embodiment, the request can be a read command received at a memory sub-system controller (e.g., the memory sub-system controller 115 of FIG. 1). The processing logic may initiate a read operation with respect to a set of target cells in response to receiving the request. In one example, the processing logic may initiate an operation to correct errors with respect to a set of target cells in response to receiving a request to perform a read error-handling operation in response to detecting a read error. The request may be initiated as an option in an error-handling flow. The read error may be detected in response to performing a host-initiated read operation or performing a calibration operation.

In some implementations, the processing logic may process the read command by entering a first read error-handling operation in an error-handling flow and completing the first read error-handling operation.

In some implementations, the processing logic may retrieve, from a data structure (e.g., table 300A of FIG. 3) stored in a system metadata area of a memory device, a set of temperature compensation values for a set of parameters associated with temperature compensation for the read operation. The set of parameters associated with temperature compensation can include read level temperature compensation parameters, sensing time temperature compensation parameter, source plate potential temperature compensation parameter, wordline group temperature compensation parameter, etc. In one example, the read level temperature compensation parameters (e.g., L1, L2, . . . L15) can be programmed into a parameter register, which stores an offset voltage applied to the read level used to read data from a memory cell.

In another example, the sensing time temperature compensation parameter (e.g., tsense) can be programmed into a parameter register, which stores an offset voltage associated with sensing time used to read data from a memory cell.

In yet another example, the source plate potential temperature compensation parameter (e.g., vslot) can be programmed into a parameter register, which stores an offset voltage associated with source plate potential used to read data from a memory cell.

In yet another example, the wordline groups temperature compensation parameter (e.g., WG1, WG2, . . . ) can be programmed into a parameter register, which stores an offset voltage associated with wordline groups used to read data from a memory cell. Other temperature compensation parameters based on other level of granularity can be used, such as per cell, per block, per package, etc.

At operation 220, the processing logic may determine a temperature of the set of memory cells. The processing logic may determine the temperature by using the temperature read from a temperature sensor at the time of receiving the read command. In some implementations, the processing logic may determine the temperature by using the temperature read from a temperature sensor at the time of performing or completing the first read error handling operation in an error handling flow. In some implementations, the processing logic can determine a first temperature of the set of memory cells, where the first temperature is associated with a first error handing operation in the error handling flow directed to the set of memory cells.

In one embodiment, the processing logic may obtain a temperature measurement value from a temperature sensor on the memory device 130, such as an on-die temperature sensor. Depending on the embodiment, the processing logic may either query temperature sensor for a new temperature measurement in response to receiving a request (e.g., the request at operation 210), or may use a most recently measured temperature value (e.g., when temperature measurements are routinely taken at periodic intervals on memory device 130). In another embodiment, the processing logic may receive a temperature measurement value from a temperature sensor external to the memory device, such as a sensor located elsewhere in memory sub-system 110.

In one embodiment, the set of memory cells may be defined to have the same temperature change and a temperature measured at certain memory cells may be used as a representative value of the temperature of the set of memory cells. In one embodiment, memory sub-system controller 115 tracks the temperature at a certain level of granularity, such as by segment, by memory die, by memory device, etc. Accordingly, temperature compensation management component 113 can retrieve the temperature associated with the segment of the memory device including the set of memory cells, such as from a data structure maintained in local memory 119 or elsewhere on memory device 130.

Figure 3A:

In some implementations, the temperature is determined during or after a first error handing operation in the error handling flow, where a default temperature compensation coefficient is used in the first error handing operation, and in such cases, a set of default temperature compensation values can be calculated, using a predefined formula, based on the temperature compensation coefficient for the determined temperature with respect to each of a set of parameters associated with temperature compensation and applied in the first error handing operation. As described above, the temperature compensation ("tempco") value is an offset to be applied to a read voltage to compensate for the voltage shift due to temperature variation, and a memory device can be manufactured with default temperature compensation coefficients to represent the temperature compensation values. FIG. 3A illustrates a table 300A with multiple parameters associated with temperature compensation. The table 300A includes a temperature compensation parameter field, a temperature compensation coefficient field, and a temperature compensation value (with respect to temperature) field. The temperature compensation parameter field refers to the set of parameters associated with temperature compensation, including read level temperature compensation parameters (e.g., read levels L1-L3 corresponding to valleys V0-V2, read levels L4-L6 corresponding to valleys V3-V5, read levels L7-L9 corresponding to valleys V6-V8, read levels L10-L12 corresponding to valleys V9-V11, read levels L13-L15 corresponding to valleys V12-V14), sensing time temperature compensation parameter (e.g., tsense), and source plate potential temperature compensation parameter (e.g., vslot).

The temperature compensation coefficient field provides a set of values of the temperature compensation coefficient ($t_c$), which can be used to calculate the temperature compensation values with respect to temperature (T) specified in the temperature compensation value (with respect to temperature) field. In table 300A, the values provided in the temperature compensation coefficient field are default values. In some implementations, the temperature compensation values can be calculated by using a predetermined formula, for example, the formula: tempco value=$(T_{ref}-T)\times t_c/128$, where $T_{ref}$ is a reference temperature, $t_c$ is the temperature compensation coefficient, T is the temperature. In some implementations, the temperature compensation value can be determined as the value of $(T_{ref}-T)\times t_c$ right-shift by 7 bits and thus can be considered as $(T_{ref}-T)\times t_c/128$.

As an illustrative example shown in FIG. 3A, at temperature 26° C., the temperature compensation parameters L1-L3 has a temperature compensation coefficient at a value of 28, if the reference temperature is 90° C., using the formula above, the temperature compensation value is 14. That is, at temperature 26° C., an offset that is equal to 14 would be applied to a read voltage to compensate for the voltage shift due to temperature variation for read levels L1-L3. At temperature 27° C., using the same condition described above, the temperature compensation value is 13 (the calculated value is 13.78, however because the fractional part of a number cannot be applied, only the integer part would be used). That is, at temperature 27° C., an offset that is equal to 13 would be applied to a read voltage to compensate for the voltage shift due to temperature variation for read levels L1-L3. Therefore, a minor temperature fluctuation, e.g., 1° C. as shown here, can result in different temperature compensation value to be applied, which can cause threshold voltage shifts and high RBER as explained previously.

As another illustrative example shown in FIG. 3A, at temperature 26° C., the temperature compensation parameters tsense has a temperature compensation coefficient at a value of 6, if the reference temperature is 90° C., using the formula above, the temperature compensation value is 3. That is, an offset that is equal to 3 would be applied to a read voltage to compensate for the voltage shift due to temperature variation for sensing time. At temperature 27° C., using the same condition described above, the temperature compensation value is 2 (the calculated value is 2.95, however because the fractional part of a number cannot be applied, only the integer part would be used). That is, at temperature 27° C., an offset that is equal to 2 would be applied to a read voltage to compensate for the voltage shift due to temperature variation for sensing time. Therefore, a minor temperature fluctuation, e.g., 1° C. as shown here, can result in different temperature compensation value to be applied, which can cause threshold voltage shifts and high RBER as explained previously.

At operation 230, the processing logic determines an offset value to a respective temperature compensation coefficient for each respective parameter of a set of parameters associated with the read operation, where the offset value is determined along with a temperature range of the determined temperature.

In some implementations, the processing logic can determine, based on the determined temperature, the default temperature compensation coefficient, and the default temperature compensation values, a temperature range of the determined temperature and an offset value to the temperature compensation coefficient for one or more parameters of the set of parameters associated with temperature compensation. The temperature range corresponds to the offset value. The offset value and the temperature range are determined in a manner so that when applying the offset value to the respective temperature compensation coefficient to derive a respective adjusted temperature compensation value, the respective adjusted temperature compensation value of the respective parameter is kept in a lock-in value in a case of a temperature (e.g., a second temperature) measured during a subsequent operation of the first error handling operation in the error-handling flow falls in the temperature range of the determined temperature (e.g., the first temperature).

Specifically, when a first temperature is associated with a precedent error handing operation in an error handling flow directed to the set of memory cells, and a second temperature is associated with a subsequent error handing operation in the error handling flow directed to the set of memory cells, the temperature range of the first temperature and the corresponding offset value are determined in a manner of keeping the temperature compensation value used in the subsequent error handing operation unchanged from a temperature compensation value used in the precedent error handing operation, responsive to determining that the second temperature falls in the temperature range of the first temperature, wherein the temperature compensation value used in the subsequent operation is calculated based on the offset value and a default temperature compensation coefficient, and wherein the temperature compensation value used in the precedent operation is calculated based on the default temperature compensation coefficient.

For example, the change in tempco value=$(T_{ref}-(T+T\Delta))\times(t_c+t_o)/128=(T_{ref}-T)\times t_c/128+(T_{ref}-(T+T\Delta))\times t_o/128-T\Delta\times t_c/128$ caused by $T_A$ and $t_o$ should be less than 1 so that the digital value won't change, which leads to $0<=mod((T_{ref}-T)\times t_c, 128)+mod((T_{ref}-(T+T\Delta))\times t_o, 128)+mod(T\Delta\times t_c, 128)<128$, where $T_{ref}$ is a reference temperature, $t_c$ is the temperature compensation coefficient, $t_o$ is the offset value to the temperature compensation coefficient, T is the temperature, $T\Delta$ is the temperature range of the temperature. For known reference temperature $T_{ref}$, known temperature compensation coefficient $t_c$, and known temperature T, the temperature range $T_A$ and the offset value $t_o$ can be calculated using the above equation.

The processing logic can calculate an offset value to temperature compensation coefficient and the corresponding temperature range of the determined temperature so that when the temperature changes by a +/−TA ° C. after the first read error handling operation performed at the temperature T, the temperature compensation value applied would not be changed. For example, at temperature 26° C., the temperature compensation parameters tsense has a temperature compensation coefficient at a default value of 6 and the corresponding temperature compensation value is 3, as shown in FIG. 3A; the processing logic may calculate the offset value+1 to the temperature compensation coefficient, making the adjusted temperature compensation coefficient having a value of 7 and the temperature range having a value of +/−5° C. of 26° C. As such, when the temperature T ranges from 21° C. to 31° C., the temperature compensation parameter tsense has a temperature compensation coefficient at an adjusted value of 7 and the corresponding adjusted temperature compensation value is 3, which is the same as the temperature compensation value at temperature 26° C. The processing logic may calculate the offset value and the temperature range through an algorithm. The processing logic may calculate the offset value and the temperature range for each of the set of parameters associated with temperature compensation. The processing logic may calculate the offset value and the temperature range for the temperature determined at operation 220.

At operation 240, the processing logic may store the offset value for use in processing a subsequent operation after a first read error handling operation in an error handling flow. The processing logic may also store the temperature range corresponding to the offset value. In some implementations, the processing logic may store the offset value and the temperature range in a data structure in a memory device. The data structure may include a table having plurality of entries, each entry corresponding to a temperature compensation parameter at a temperature. In some implementations, the processing logic may store a set of parameters representing the offset value and the temperature range for each parameter at the respective temperature.

Figure 4:
FIG. 4 illustrates an example of a table including a set of parameters for adaptive temperature compensation, in accordance with some embodiments of the present disclosure.

As an illustrative example shown in FIG. 4, the table 400 includes a temperature compensation parameter field, a temperature compensation coefficient field, and a temperature compensation coefficient offset value & temperature range (with respect to temperature) field. The temperature compensation parameter field and the temperature compensation coefficient field are similar as described above with respect to table 300A. The temperature compensation coefficient offset value & temperature range (with respect to temperature) field provides a pair of parameters for each parameter at a temperature, including the first parameter and the second parameter. The first parameter (e.g., a temperature compensation coefficient offset value parameter) represents an offset value to the temperature compensation coefficient, which can be used by adding the offset value to the temperature compensation coefficient to deriving an adjusted temperature compensation coefficient, and a second parameter (e.g., a temperature range parameter) represents a temperature range of the determined temperature. The offset value can be a positive value or a negative value. The temperature range can be represented by TA, meaning that the temperature change from the determined temperature are symmetric in both directions (i.e., +/−$T_A$) of the determined temperature, or can be represented by a range from $T_{low}$ to $T_{high}$, meaning that the temperature changed from the determined temperature can be any temperature falling within the range.

As an illustrative example shown in FIG. 4, at temperature 26° C., the temperature compensation parameter tsense has the first parameter in the bracket as an offset value 1 and a second parameter in the bracket as a temperature range 5, which represents that when the temperature T ranges from 21° C. to 31° C., the temperature compensation parameters tsense has a temperature compensation coefficient at an adjusted value of 7 with a temperature compensation value unchanged from that at temperature 26° C. At temperature 27° C., the temperature compensation parameter tsense has the first parameter in the bracket as an offset value −1 and a second parameter in the bracket as a temperature range 5, which represents that when the temperature T ranges from 22° C. to 32° C., the temperature compensation parameters tsense has a temperature compensation coefficient at an adjusted value of 5 with a temperature compensation value unchanged from that at temperature 27° C.

As another illustrative example shown in FIG. 4, at temperature 26° C., the temperature compensation parameter L1-L3 has the first parameter in the bracket as an offset value 1 and a second parameter in the bracket as a temperature range 2, which represents that when the temperature T ranges from 24° C. to 28° C., the temperature compensation parameter L1-L3 has a temperature compensation coefficient at an adjusted value of 29 with a temperature compensation value unchanged from that at temperature 26° C. At temperature 27° C., the temperature compensation parameter L1-L3 has the first parameter in the bracket as an offset value –1 and a second parameter in the bracket as a temperature range 1, which represents that when the temperature T ranges from 26° C. to 28° C., the temperature compensation parameter L1-L3 has a temperature compensation value unchanged from that at temperature 27° C.

At operation 250, the processing logic may adjust, based on the offset value of the respective memory cell, the respective temperature compensation value in processing the subsequent operation. In some implementations, the processing logic may, at the beginning of processing the subsequent operation, determine a current temperature and check whether the current temperature falls in the range provided by the temperature range, responsive to determining the current temperature falls in the range, calculate the adjusted temperature compensation coefficient by adding the offset value to a default temperature compensation coefficient, and calculate the adjusted temperature compensation value based on the adjust temperature compensation coefficient using a predefined formula (e.g., the formula shown above). The processing logic then applies the adjusted temperature compensation value in processing the subsequent operation.

In some implementations, the processing logic may determine a second temperature of the set of memory cells, wherein the second temperature is associated with a subsequent error handling operation of the first error handing operation in the error handling flow directed to the set of memory cells. The processing logic may determine whether the second temperature falls in the temperature range of the first temperature. Responsive to determining that the second temperature falls in the temperature range of the first temperature, the processing logic may adjust, based on the offset value, a temperature compensation value used in the subsequent operation.

FIG. 3B illustrates temperature compensation values determined at temperature 26° C. after applying the temperature compensation value adjustments, and FIG. 3C illustrates temperature compensation values determined at temperature 27° C. after applying the temperature compensation value adjustments. As an illustrative example shown in FIG. 3B, after the first read error handling operation performed at temperature 26° C., the processing logic may, at the beginning of processing the subsequent operation, determine a current temperature to be, for example, 28° C., and determine that the current temperature falls in the range provided by the temperature range for a temperature compensation parameter. In the example shown in FIG. 3B, each temperature compensation parameter has a temperature range at least covering from 24° C. to 28° C., i.e., +/–2° C. range from 26° C. The processing logic may, responsive to determining the current temperature falls in the range, calculate the adjusted temperature compensation coefficient using the offset value, for a temperature compensation parameter. As shown in the temperature compensation coefficients field in table 300B, the adjusted temperature compensation coefficient is calculated by adding the respective offset value for each temperature compensation parameter to the respective default temperature compensation coefficient. The processing logic may calculate the adjusted temperature compensation value based on the adjusted temperature compensation coefficient for the temperature compensation parameter. As shown in the temperature compensation value field in table 300B, the adjusted temperature compensation value is calculated using the predefined formula based on the respective adjusted temperature compensation coefficient for each temperature compensation parameter. The processing logic may apply the adjusted temperature compensation value in processing the subsequent operation so that the temperature fluctuation would not affect the error handling operations.

As an illustrative example shown in FIG. 3C, after the first read error handling operation performed at temperature 27° C., the processing logic may, at the beginning of processing the subsequent operation, determine a current temperature to be, for example, 25° C., and determine that the current temperature falls in the range provided by the temperature range for a temperature compensation parameter. In the example shown in FIG. 3B, each temperature compensation parameter has a temperature range at least covering from 24° C. to 28° C., i.e., –3° C. and +1° C. range from 27° C. The processing logic may, responsive to determining the current temperature falls in the range, calculate the adjusted temperature compensation coefficient using the offset value, for a temperature compensation parameter. As shown in the temperature compensation coefficients field in table 300C, the adjusted temperature compensation coefficient is calculated by adding the respective offset value for each temperature compensation parameter to the respective default temperature compensation coefficient. The processing logic may calculate the adjusted temperature compensation value based on the adjusted temperature compensation coefficient for the temperature compensation parameter. As shown in the temperature compensation value field in table 300C, the adjusted temperature compensation value is calculated using the predefined formula based on the respective adjusted temperature compensation coefficient for each temperature compensation parameter. The processing logic may apply the adjusted temperature compensation value in processing the subsequent operation so that the temperature fluctuation would not affect the error handling operations.

In some implementations, the processing logic may apply the adjusted temperature compensation value in processing all subsequent operations until the error-handling flow is completed. In some implementations, the processing logic may restore the adjusted temperature compensation coefficient and the adjusted temperature compensation value to the respective default values after the error-handling flow is completed. In some implementations, the processing logic may use the process provided by operations 210-250 after a first error handling operation in an error-handling flow or at the stage of any error handling operation in an error-handling flow.

Figure 5:
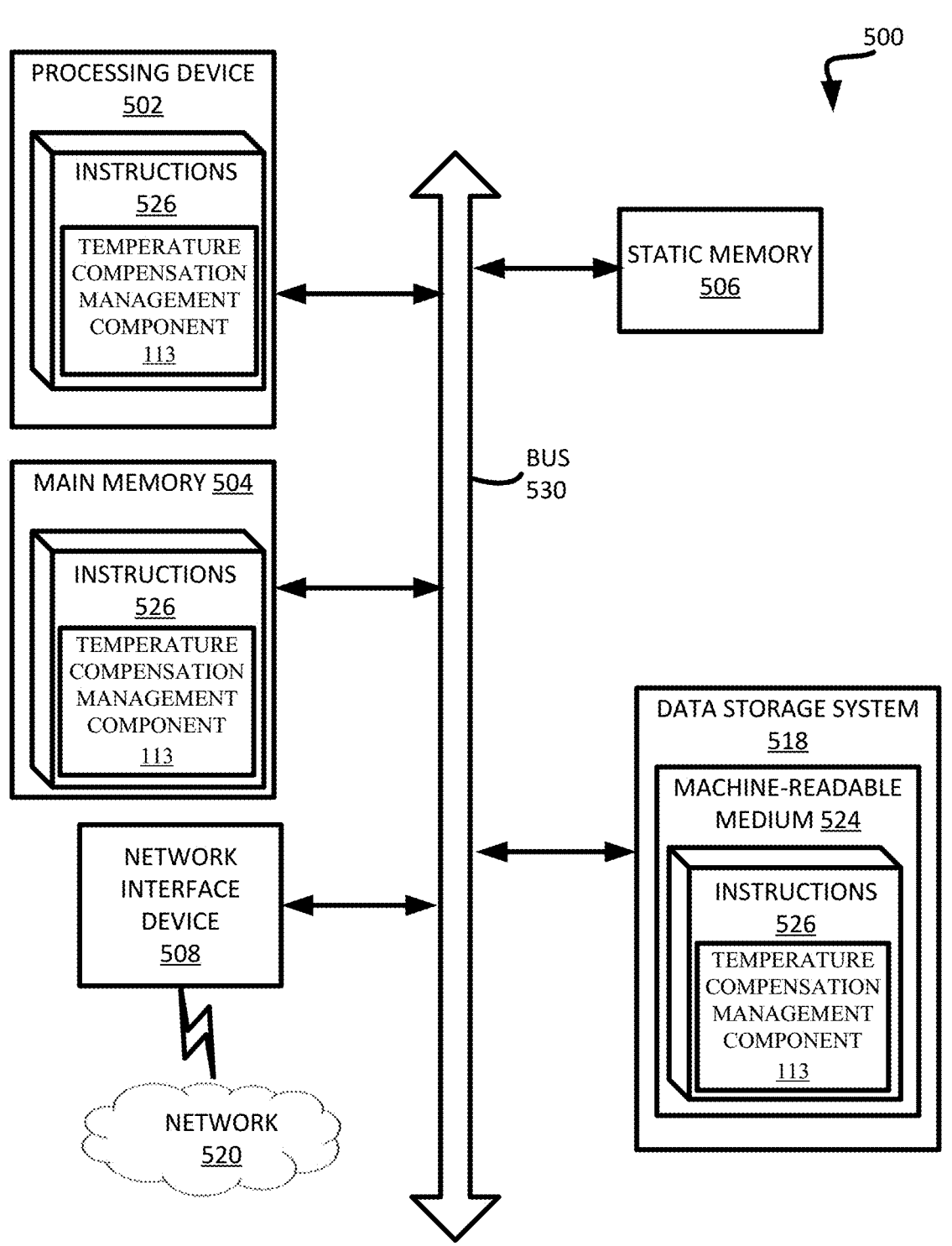
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature compensation management component 113 of FIG. 1).

In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a QLC compaction component (e.g., the temperature compensation management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device; and a processing device, operatively coupled to the memory device, the processing device to perform operations comprising:

receiving a request to perform a read operation, the request identifying a set of memory cells in a portion of a memory device;

determining a first temperature of the set of memory cells, wherein the first temperature is associated with a first error handing operation of an error handling flow directed to the set of memory cells;

determining an offset value to be applied to a temperature compensation coefficient of a parameter of a set of parameters associated with the set of memory cells, wherein the offset value is associated with a temperature range comprising the first temperature;

determining a second temperature of the set of memory cells, wherein the second temperature is associated with a second error handling operation following the first error handing operation of the error handling flow directed to the set of memory cells; and responsive to determining that the second temperature falls in the temperature range comprising the first temperature, adjusting, based on the offset value, a temperature compensation value used in the second error handling operation.

2. The system of claim 1, wherein a second temperature compensation value used in the second error handling operation is equal to a first temperature compensation value used in the first error handing operation.

3. The system of claim 2, wherein the second temperature compensation value used in the second error handling operation is calculated based on the offset value and a default value of the temperature compensation coefficient.

4. The system of claim 2, wherein the first temperature compensation value used in the first error handing operation is calculated based on a default value of the temperature compensation coefficient.

5. The system of claim 1, wherein adjusting the temperature compensation value used in the subsequent operation further comprises:

making a second temperature compensation value used in the second error handling operation equal a first temperature compensation value used in the first error handing operation.

6. The system of claim 1, wherein the operations further comprise:

storing the temperature range and the offset value in a data structure, wherein the data structure comprises a plurality of entries, each entry corresponding to a respective parameter of the set of parameters and the first temperature.

7. The system of claim 1, wherein each of the set of the memory cells comprises a multi-level memory cell and is configured to store a charge corresponding to one of a plurality of voltage levels, each of the plurality of voltage levels representing a corresponding logical data value, and wherein the set of parameters corresponds to at least one of the plurality of voltage levels.

8. The system of claim 1, wherein the set of parameters corresponds to at least one of: a sensing time, a source plate potential, and at least one of a plurality of wordline groups.

9. The system of claim 1, wherein the operations further comprise:

responsive to determining that the second temperature is outside of the temperature range of the first temperature, using a default temperature compensation value in the second error handling operation.

10. The system of claim 1, wherein the operations further comprise:

restoring the adjusted temperature compensation value to a default value responsive to completing the error handling flow.

11. A method comprising:

receiving, by a processing device, a request to perform a read operation, the request identifying a set of memory cells in a portion of a memory device;

determining a first temperature of the set of memory cells, wherein the first temperature is associated with a first error handing operation of an error handling flow directed to the set of memory cells;

determining an offset value to be applied to a temperature compensation coefficient of a parameter of a set of parameters associated with the set of memory cells, wherein the offset value is associated with a temperature range comprising the first temperature;

determining a second temperature of the set of memory cells, wherein the second temperature is associated with a second error handling operation following the first error handing operation of the error handling flow directed to the set of memory cells; and responsive to determining that the second temperature falls in the temperature range comprising the first temperature, adjusting, based on the offset value, a temperature compensation value used in the second error handling operation.

12. The method of claim 11, wherein a second temperature compensation value used in the second error handling operation is equal to a first temperature compensation value used in the first error handing operation, wherein the second temperature compensation value used in the second error handling operation is calculated based on the offset value and a default value of the temperature compensation coefficient, and wherein the first temperature compensation value used in the first error handing operation is calculated based on the default value of the temperature compensation coefficient.

13. The method of claim 11, wherein adjusting the temperature compensation value used in the subsequent operation further comprises: making a second temperature compensation value used in the second error handling operation equal a first temperature compensation value used in the first error handing operation.

14. The method of claim 11, further comprising:

storing the temperature range and the offset value in a data structure.

15. The method of claim 14, wherein the data structure comprises a plurality of entries, each entry corresponding to a respective parameter of the set of parameters and the first temperature.

16. The method of claim 11, wherein each of the set of the memory cells comprises a multi-level memory cell and is configured to store a charge corresponding to one of a plurality of voltage levels, each of the plurality of voltage levels representing a corresponding logical data value, and wherein the set of parameters corresponds to at least one of the plurality of voltage levels.

17. The method of claim 11, wherein the set of parameters corresponds to at least one of: a sensing time, a source plate potential, and at least one of a plurality of wordline groups.

18. The method of claim 11, wherein determining the first temperature further comprises measuring the first temperature during the first error handing operation.

19. The method of claim 11, further comprising:
restoring the adjusted temperature compensation value to a default value responsive to completing the error handling flow.

20. A non-transitory computer readable storage medium including instructions that, when executed by a processing device, cause the processing device to perform operations comprising:

receiving a request to perform a read operation, the request identifying a set of memory cells in a portion of a memory device;

determining a first temperature of the set of memory cells, wherein the first temperature is associated with a first error handing operation of an error handling flow directed to the set of memory cells;

determining an offset value to be applied to a temperature compensation coefficient of a parameter of a set of parameters associated with the set of memory cells, wherein the offset value is associated with a temperature range comprising the first temperature;

determining a second temperature of the set of memory cells, wherein the second temperature is associated with a second error handling operation following the first error handing operation of the error handling flow directed to the set of memory cells; and responsive to determining that the second temperature falls in the temperature range comprising the first temperature, adjusting, based on the offset value, a temperature compensation value used in the second error handling operation.

\* \* \* \* \*